US008718968B2

(12) United States Patent
Poeltl

(10) Patent No.: US 8,718,968 B2
(45) Date of Patent: May 6, 2014

(54) CIRCUIT BREAKER INTERRUPTER TRAVEL CURVE ESTIMATION

(75) Inventor: Anton F. Poeltl, Greensburg, PA (US)

(73) Assignee: ABB Technology AG, Zurich (CH)

(*) Notice: Subject to any disclaimer, the term of this patent is extended or adjusted under 35 U.S.C. 154(b) by 573 days.

(21) Appl. No.: 12/872,057

(22) Filed: Aug. 31, 2010

(65) Prior Publication Data
US 2012/0053886 A1    Mar. 1, 2012

(51) Int. Cl.
*G01D 1/00* (2006.01)
*G01R 31/327* (2006.01)
*H01H 1/00* (2006.01)
*H01H 11/00* (2006.01)

(52) U.S. Cl.
CPC .......... *G01R 31/3274* (2013.01); *H01H 1/0015* (2013.01); *H01H 11/0062* (2013.01)
USPC .......................................... 702/127; 702/149

(58) Field of Classification Search
CPC ............. G01R 31/3274; H01H 1/0015; H01H 11/0062
USPC .......................................... 702/127, 149, 155
See application file for complete search history.

(56) References Cited

U.S. PATENT DOCUMENTS

| | | | | |
|---|---|---|---|---|
| 2,125,835 | A | * | 8/1938 | MacNeill et al. ................ 361/67 |
| 3,500,009 | A | * | 3/1970 | Bell .................................. 218/1 |
| 3,761,735 | A | * | 9/1973 | Turner et al. ................... 307/112 |
| 5,629,869 | A | | 5/1997 | Johnson et al. |
| 5,638,296 | A | * | 6/1997 | Johnson et al. ............... 700/286 |
| 6,531,938 | B1 | * | 3/2003 | Smith et al. ...................... 335/14 |
| 2005/0168891 | A1 | | 8/2005 | Nilman-Johansson et al. |
| 2008/0120080 | A1 | * | 5/2008 | Nasle ................................. 703/13 |
| 2009/0266795 | A1 | * | 10/2009 | Kriegel et al. ................. 218/154 |
| 2010/0147395 | A1 | * | 6/2010 | Meier et al. ...................... 137/14 |

FOREIGN PATENT DOCUMENTS

WO     0039823     7/2000
WO     2008000105 A1     1/2008

OTHER PUBLICATIONS

Andrusca et al., "Embedded System and Software Application for Monitoring and Diagnosis of High Voltage Circuit Breakers", Oct. 25-27, 2012, IEEE International Conference and Exposition on Electrical and Power Engineering, pp. 159-166.*
Manea et al., "Complex Methods to Diagnose the Technical State of the Medium and High Voltage Circuit Breaker after Short-Circuit Events", Jun. 18-21, 2001, IEE Conference Publication No. 482, pp. 1.50.*

(Continued)

*Primary Examiner* — Mischita Henson
(74) *Attorney, Agent, or Firm* — Driggs, Hogg, Daugherty & Del Zoppo Co., L.P.A.; Anthony M. Del Zoppo, III; Patrick J. Daugherty

(57) ABSTRACT

A system includes memory that stores pre-determined high voltage circuit breaker contact travel distance information and a processor that estimates a travel curve for at least one of a closed, an open or a combination of closed and open operations for the contacts based on both one or more travel distances of the stored travel distance information and one or more time values corresponding to state transitions of switches between closed and open states, wherein the switches are affixed to the contacts so as to transition between closed and open states as the contacts move between closed and open positions.

24 Claims, 5 Drawing Sheets

(56) References Cited

OTHER PUBLICATIONS

Ramming et al., "Cold Characteristic Development Test of a New SF6 High Voltage Circuit Breaker", 2006, IEEE, pp. 1-4.*
International search report for PCT/US2011/047446 published as WO2012030498A1.
ABB CBS, Condition monitoring devices for SF6 power circuit breakers, 2010, 2 sheets, http://www.abb.com/products/db003db002618/905b1a928fa185d1c125 . . . .
INCON, Optimizer circuit breaker wear and condition monitor, 2010, 4 sheets, http:www.incon.com/products/opt.spx.
Hathaway Systems Limited, Compact and affordable, the ideal breaker monitor, A low cost condition monitoring system for circuit breakers BCM 200, 2010, 3 sheets.

* cited by examiner

CIRCUIT BREAKER INTERRUPTER TRAVEL CURVE ESTIMATION

BACKGROUND

The following generally relates to determining a travel curve for circuit breaker interrupter contacts of a high-voltage circuit breaker and more particularly to estimating one or more travel curves with or without actual contact travel distance measurements being made during an open and/or closed breaker operation via contact travel sensors.

Condition-based maintenance of high-voltage circuit breakers has been implemented by incorporating microprocessor controlled on-line condition monitoring devices and sensors with the high-voltage circuit breakers. Generally, the sensors/devices are configured to measure information used to calculate critical parameters that represent the health of the circuit breaker. An example of such a sensor is a contact travel sensor. Such a sensor is capable of tracking the position of the breaker contacts as they move from open to closed positions, and vice versa, with a resolution of about 0.1-1.0 mm (millimeters) and a sample period of typically 0.1-0.3 ms (milliseconds).

The graphical representation of the contact position over time has been referred to as the travel curve. A travel curve is recorded over an acquisition time period, for example, of 150 ms or so. The types and sequences of operation that are captured during this time period are close (C), open (O), and close/open (C-O). The open operation has been referred to as a "trip" operation. More complex sequences such as open/close/open (O-C-O) may be captured with longer acquisition time periods or captured over two ore more discontinuous time periods.

Once a travel curve is recorded, important parameters can be derived from it. These parameters include, but are not limited to: over travel, which is the distance temporarily traveled in excess of the designed end-position; rebound, which is the distance temporarily traveled away from the designed end-position as result of over travel; total travel, which is the distance traveled between the point farthest from the end-position and the point farthest from the start-position; reaction time, which is the time from initiation of the operation until the contacts start to move; contact velocity, which is the slope of a straight line connecting two points on the travel curve as specified by the manufacturer, and mechanism time, which is the time from initiation of the operation until a contact position is reached where the contacts engage or separate.

The component of a circuit breaker designed to make or break currents of various magnitudes is called the interrupter. During the service life of the circuit breaker, its interrupter is subjected to wear. The wear is accumulated during arcing periods, i.e. the period during an open or close operation where the contacts are physically separated by a gap and the gap is bridged by an electrical arc. The arc bridges a dedicated set of contacts that are designed for this purpose and are referred to as arcing contacts. Various methods exist to calculate or at least approximate interrupter wear by measuring the current through the circuit breaker. These methods are sometimes referred to as interrupter wear algorithms.

In addition to the breaker current, an interrupter wear algorithm must have knowledge of the point in time when the arcing contacts separate during an open operation or engage during a close operation. This knowledge may come from monitoring an auxiliary switch that is mechanically linked to the breaker contacts and closes and opens at the same time the arcing contacts separate or engage. Examples of such auxiliary switches include, but are not limited to, A and B switches. An A switch closes during a close operation after contacts have traveled about 70% towards their end-position, and a B-switch opens during a close operation after the contacts have traveled about 30% towards their end-position. The exact values are breaker and model dependent. The A-switch opens and the B-switch closes during an open operation. The typical use of auxiliary switches is for control schemes and for remote indication of the breaker contacts. Because the latter function is fundamental to the operation of high-voltage circuit breakers, breakers are equipped with auxiliary switches as standards components.

Besides interrupter wear calculation, typical on-line condition monitoring devices use auxiliary switches to monitor the breaker timing. However, rather than deriving parameters such as reaction time or contact velocity, they simply monitor whether the auxiliary switches close or open within a specified time range. Alternatively, if a travel sensor is used, the time when the arcing contacts engage or separate can by derived by finding the corresponding point on the travel curve. Use of a travel sensor also enables more sophisticated interrupter wear algorithms. Not only can the time be determined when the arcing contact engage or separate but also when other parts of interrupter such as nozzles are subjected to arcing as this is a function of the contact position.

Travel measurement is not only employed by on-line condition monitors. It is also used as part of off-line measurements during factory tests, commissions and yearly (or other time-based) maintenance. Because its use is ubiquitous in the electric power industry, the graphical representation in form of a travel curve itself has value to the user in addition to the important parameters that can be derived from the travel curve.

Unfortunately, the use of travel sensors for on-line condition monitoring poses various technical and economical challenges. While various rotary and linear position encoders are commercially available, their successful installation on a high-voltage circuit breaker is non-trivial. That is, the mounting locations that are used for off-line travel sensors can generally not be used, because these locations are not weather protected. The locations that are weather protected often don't have parts of the mechanism accessible that are suitable to pick up either linear or rotary motion, in particular motion which is proportional to or at least unambiguously linked to the contact travel to be measured.

Once a suitable mounting location for an on-line travel sensor is identified and the necessary mounting provisions engineered, the travel sensor arrangement should be life-tested for at least 2000 operations (C and O) to ensure that the mounting and/or the sensor will not fail during its intended service life. Life testing of a travel sensor installation is economical only during the prototyping phase of a new circuit breaker model, since life test have to be performed either way. In addition, it is more costly for current production models because a breaker has to be built specifically for the purpose of the travel sensor life test and can obviously not be sold afterwards. Furthermore, for models that are out of production, the only specimens are breakers still in service and subjecting these breakers to a life test is not a viable option. Therefore, designing an on-line monitoring system that uses travel sensors is either not economically viable or carries great product liability risks.

SUMMARY

Aspects of the present application address these matters, and others.

According to one aspect, a system includes memory that stores pre-determined high voltage circuit breaker contact travel distance information and a processor that estimates a travel curve for at least one of a closed, an open or a combination of closed and open operations for the contacts based on both one or more travel distances of the stored travel distance information and one or more time values corresponding to state transitions of switches between closed and open states, wherein the switches are affixed to the contacts so as to transition between closed and open states as the contacts move between closed and open positions.

According to another aspect, a method includes estimating, via a processor, a travel curve for at least one of a closed, an open or a combination of closed and open operations of circuit interrupter contacts of a high voltage circuit breaker based on both one or more predetermined travel distances of the contacts with respect to each other and one or more time values corresponding to state transitions of switches between closed and open states during a breaker operation, wherein the switches are affixed to the contacts so as to transition between closed and open states as the contacts move between closed and open positions.

According to another aspect, a method includes displaying a travel curve for at least one of a closed, an open or a combination of closed and open operations of circuit interrupter contacts of a high voltage circuit breaker, wherein the travel curve is estimated based on both one or more predetermined travel distances of the contacts with respect to each other and one or more time values corresponding to state transitions of switches between closed and open states, wherein the switches are affixed to the contacts so as to transition between closed and open states as the contacts move between closed and open positions.

A method includes determining, via a processor, one or more parameters for a high voltage circuit breaker based on a travel curve for at least one of a closed, an open or a combination of closed and open operations of circuit interrupter contacts of the high voltage circuit breaker, wherein the travel curve is estimated based on both one or more predetermined travel distances of the contacts with respect to each other and one or more time values corresponding to state transitions of switches between closed and open states, wherein the switches are affixed to the contacts so as to transition between closed and open states as the contacts move between closed and open positions.

Those skilled in the art will appreciate still other aspects of the present application upon reading and understanding the attached figures and description.

FIGURES

The present application is illustrated by way of example and not limitation in the figures of the accompanying drawings, in which like references indicate similar elements and in which.

DESCRIPTION

The following general relates to on-line condition monitoring in connection with a high voltage circuit breaker in which an on-line condition monitor estimates one or more travel curves (e.g., continuous and differentiable, discontinuous, etc.) based on pre-measured or pre-determined and recorded travel distances of the contacts of the breaker and sensed states of switches that are affixed to the contacts so as to open and close or vise versa with opening and closing of the contracts. In one instance, this allows for determining various parameters, such as parameters that indicate a health of the breaker, without having to use a contact travel sensor and/or measure actual travel distances of the contacts during close, open, and/or other operations of the breaker.

Figure 1:
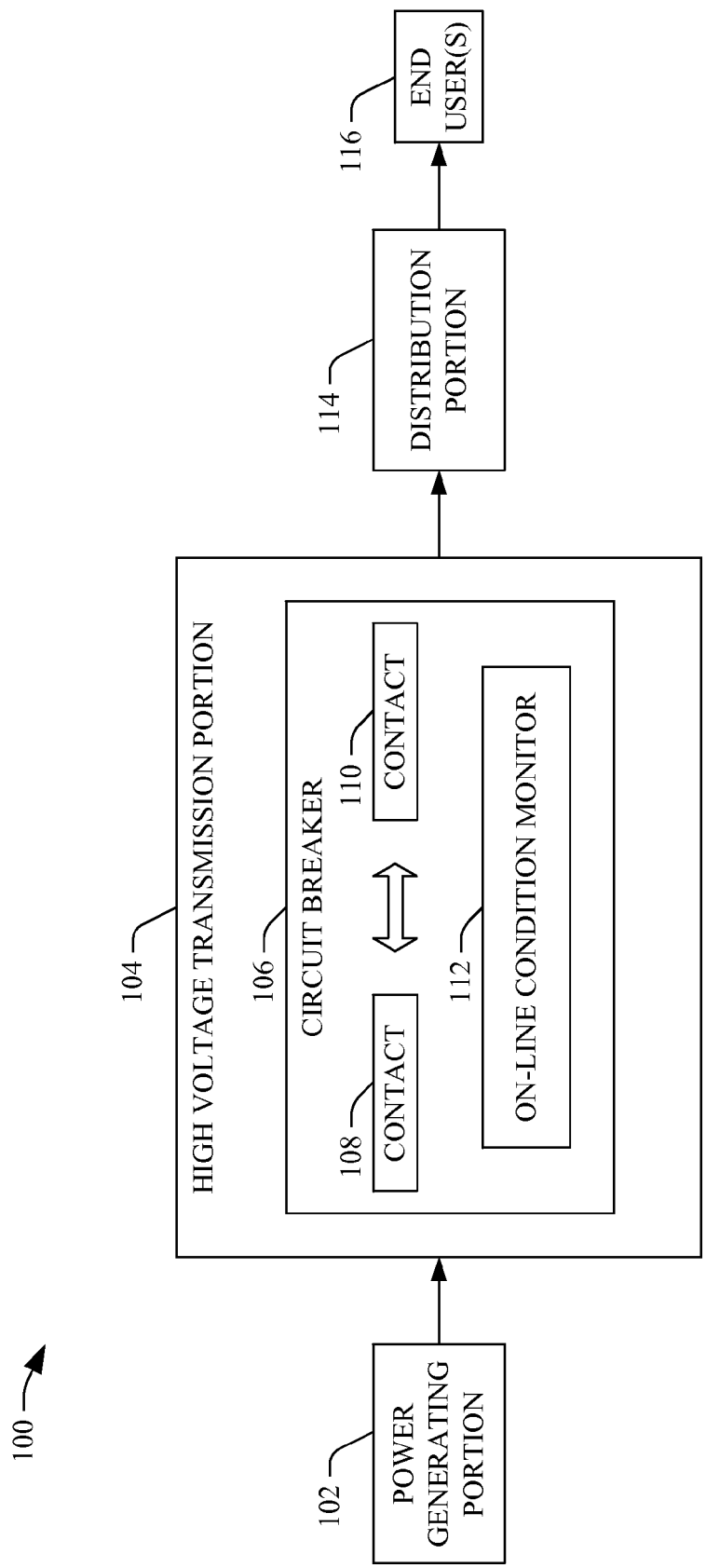
FIG. 1 illustrates an example electricity network.

FIG. 1 illustrates an example electricity network 100. The electricity network 100 includes a power generating portion 102 such as one or more power plants that generate electrical power. The power plants may generate power via a generator that converts mechanical energy into electrical energy and/or non-generator based approaches. The energy source used to turn the generator may include one or more of coal, nuclear, natural gas, hydroelectric (water), petroleum, solar, wind, geothermal, and/or other energy sources used by power generating plants. The power generated by the one or more power generating portion 102 may be in a range from megawatts (MW) to gigawatts (GW), for example, from 1 MW to 50 GW or higher.

The electricity network 100 further includes a high voltage transmission portion 104 having one or more high voltage transmission pathways that carry electrical energy from the power generating portion 102 for use by electrical power consumers or end users. The power from the power generating portion 102 is stepped up via a step up transformer or other power step up device before being carried by the voltage transmission portion 104. The illustrated high voltage transmission portion 104 carries voltages in a range from 100 kV to 230 kV or above. The high voltage transmission pathways may include high voltage overhead conductors and/or underground cables.

The high voltage transmission portion 104 includes at least one high voltage interrupter or circuit breaker 106 having electrical contacts 108 and 110. The electrical contacts 108 and 110 are configured to electrically engage to complete an electrical flow path for carrying high voltage and to selectively electrically disengage to interrupt electrical flow continuity. For the latter, the electrical contacts 108 and 110 may be disengaged in response to a fault condition such as an overload, a short circuit, or other fault condition being detected. Suitable circuit breakers include a single pole breaker that interrupt only a single pole and a gang or multiple pole breaker that concurrently interrupts multiple poles.

The high voltage circuit breaker 106 further includes an on-line condition monitor 112 (which is integrated with the breaker in this example) that facilitates monitoring a health or other state of the circuit breaker 106. As described in greater detail below, in one instance, the on-line condition monitor 112 estimates a travel curve for the contacts 108 and 110 without having to rely on actual travel distance measurements from contact travel sensors during breaker operations. (Of course, the on-line condition monitor 112 may additionally or alternatively utilize actual travel measurements to calculate the travel curve with breakers that include contact travel sensors.) In one non-limiting embodiment, the estimated travel curve is continuous and differentiable or discontinuous, and can be processed like a travel curve composed from actual travel measurements to determine various parameters such as reaction time, contact velocity, mechanism time, interrupter wear, etc. Moreover, the on-line condition monitor 112 can compare the parameters to predetermined and pre-stored thresholds and/or ranges and generate and/or invoke one or more alarms when a parameter does not satisfy a corresponding threshold and/or range.

The electricity network 100 further includes a distribution portion 114 having one or more distribution networks that facilitates delivering electricity to one or more consumers or end users 116. The illustrated distribution portion 114 carries the electricity from the transmission portion 104 to the end user 116. A step down transformer at a distribution substation is used to step the high voltage down to medium voltage such as voltage less than 50 kV, which is then carried over distribution power lines through pole-mounted transformers, which step the voltage down to low voltage such as voltages less than 1 kV and delivers the low voltages to distribution wiring and/or electricity meters of the end user 116.

Figure 2:
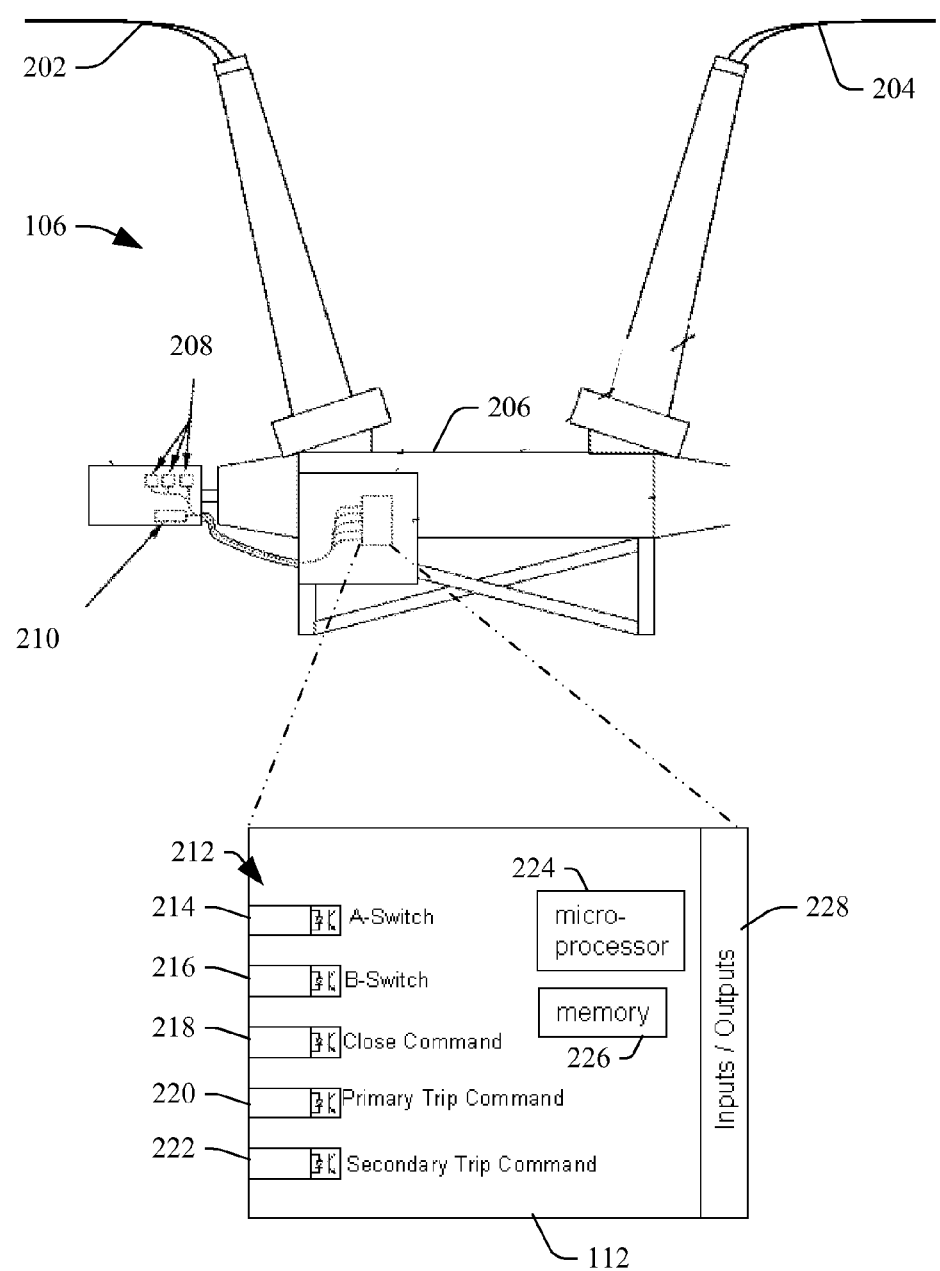
FIG. 2 illustrates an example high voltage circuit breaker with an on-line condition monitor integrated therewith.

FIG. 2 illustrates an example of the circuit breaker 106. Electrical lines 202 and 204 carry electricity to the breaker 106 and away from the breaker 106. One of the lines 202 or 204 carries electricity to one of the contacts 108 or 110 (both are enclosed in a housing 206 in this example), and the other of the lines 202 or 204 carries electricity from the other one of the contacts 108 or 110. Control coils 208 open and close the contacts 108 and 110.

Auxiliary switches 210 such as one or more A and B switches are mechanically linked to the breaker contacts 108 and 110 and open and close with the contacts 108 and 110. Various information about the contacts 108 and 110 and the switches 210 such as the distance traveled by the contacts 108 and 110 from fully open to fully closed, from fully closed until the A switch opens, from fully closed until the B switch closes, from fully open until the A switch closes, and from fully open until the B switch opens can be determined, for example, based on the design of the circuit breaker and/or through actual measurement, and recorded.

The illustrated on-line condition monitor 112 includes one or more binary indicators 212. For explanatory purposes and sake of clarity, the illustrated on-line condition monitor 112 includes five (5) binary indicators 212, including an A switch state indicator 214, a B switch state indicator 216, a close command state indicator 218, a primary trip command state indicator 220, and a secondary trip command state indicator 222. Each of the binary indicators 212 provides an indication of the state (e.g., open or closed, and present or absent) of the corresponding component or command.

In other embodiments, one or more of the binary indicators 212 may be omitted. For example, in one alternative embodiment, the secondary trip command state indicator 222 is omitted. In another embodiment, additionally or alternatively, the primary trip command state indicator 220 is omitted. With this embodiment, the close command state indicator 218 may include a close and a trip command state indicator. In yet another embodiment, the on-line condition monitor 112 includes more than five (5) binary indicators 212. The additional indicators may be used in connection with the above inputs and/or other inputs.

The on-line condition monitor 112 further includes memory 226, which can be used to store various information such as the information about the travel distances of the contacts 108 and 110, including travel from fully open to fully closed and travel from fully open or closed until the A and B switches switch states (i.e., transition from open to closed and vice versa), information about the states (on/off) of the switches 210, information about the state of the commands, and/or other information such as an estimated travel curve, parameters derived from an estimated travel curve, data that facilitates deriving the parameters, and/or other information.

The on-line condition monitor 112 further includes memory 132, which can be used to store various information such as the information about the travel distances of the contacts 108 and 110, including travel from fully open to fully closed and travel from fully open or closed until the A and B switches switch states (i.e., transition from open to closed and vice versa), information about the states (on/off) of the switches 210, information about the state of the commands, and/or other information such as an estimated travel curve, parameters derived from an estimated travel curve, data that facilitates deriving the parameters, and/or other information.

The on-line condition monitor 112 further includes input/output 228 that can be used to convey information to and from the on-line condition monitor 112. For example, the input/output 228 can be used to convey the information used to estimate a travel curve to another device, which estimates the travel curve based on the conveyed information. In another example, the input/output 228 can be used to convey an estimated travel curve. In either instance, the travel curve can be displayed on a monitor, printed and/or otherwise presented, analyzed to determine various breaker related parameters, etc. by the on-line condition monitor 112 and/or computing device located remote from the breaker 106. In another example, the input/output 228 can be used to receive a travel curve, parameters derived therefrom, and/or other information from a computing device located remote from the breaker 106.

As briefly discussed above, the on-line condition monitor 112 estimates a travel curve for the contacts 108 and 110. In this embodiment, the microprocessor 224 estimates one or more travel curves based on the information in the memory 226, such as based on the information about the travel distances of the contacts 108 and 110, and the states of the switches 210 during a breaker operation. In one non-limiting instance, a travel curve is estimated by mapping the travel distances and the switch states as a function of time (e.g., by plotting the travel distances and the switch states as a function of time) and fitting a curve to the mapped values. This is illustrated through FIGS. 3-5.

Figure 3:
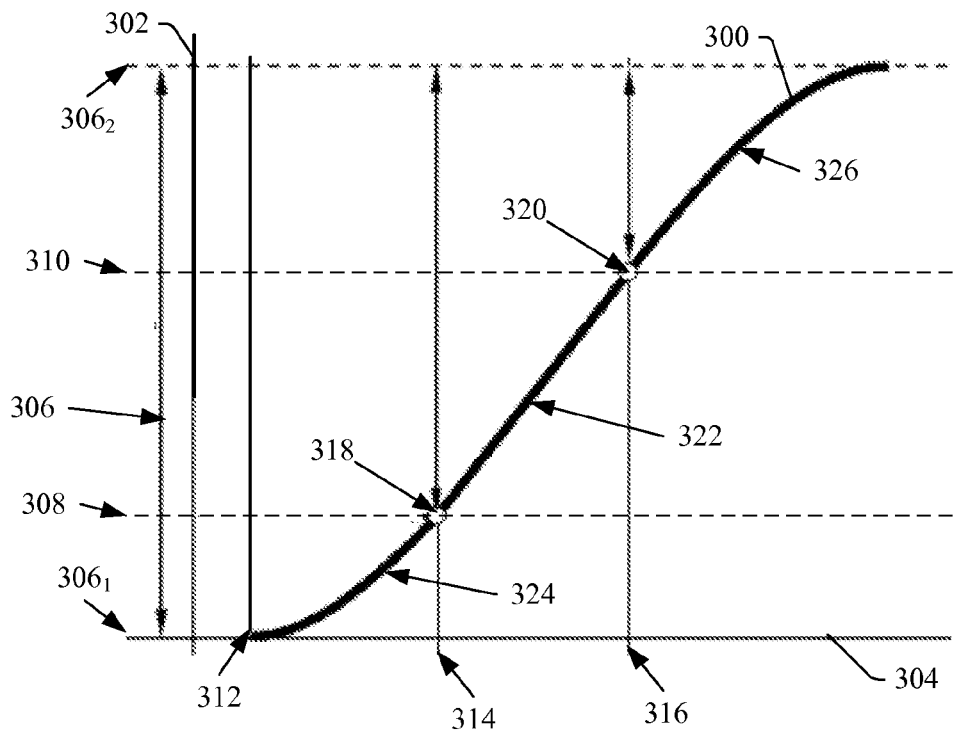
FIG. 3 illustrates an example travel curve for a close operation of the circuit breaker.

FIG. 3 illustrates an estimation of a travel curve 300 for a close operation of the breaker 106, in which the contacts 108 and 110 transition from a fully open state to a fully closed state. In FIG. 3, a y-axis 302 represents the traveled distance of the contacts and the x-axis 304 represents time.

Indicated on the y-axis 302 are a full range of motion 306 (between $306_1$ and $306_2$) of the contacts, a point 308 during the range 306 where the B switch opens, and a point 310 during the range 306 where the A switch closes. Recall that these are pre-measured or determined values, which are stored in the memory 226.

Indicated on the x-axis 304 are a point in time 312 at which a close command is received (as determined by the close command indicator 218), a point in time 314 at which the state of the B switch transitions from closed to open (as determined by the B switch indicator 216), and a point in time 316 at which the state of the A switch transitions from open to closed (as determined by the A switch indicator 214).

An intersection 318 of the points 308 and 314 and an intersection 320 of the points 310 and 316 are also indicated in FIG. 3. A first portion 322 of the travel curve 300 is estimated via the points 318 and 320 by connecting the points together. In the illustrated, the points are connected via a linear line. In other embodiments, non-linear lines can be used.

A portion 324 of the curve 300 from where the contacts are fully open to where the B switch opens is extrapolated based on the fully open position $306_1$ and the point in time when the close command is received 312, and on the intersection point 318. In this embodiment, the portion 324 is estimated as a smooth function extending from the intersection point 318 and concluding with a point of tangency at the intersection of points $306_1$ and 312.

A portion 326 of the curve 300 from where the A switch closes to where the contacts are fully closed is extrapolated based on the fully closed position $306_2$ and on the intersection point 320. Likewise, the portion 326 is estimated as a smooth function extending from the intersection point 320 to a point of tangency at the fully closed position $306_2$.

Note that the curve 300 is continuous and differentiable and starts at the fully open position $306_1$, passes through the point 318 (the intersection of 308 and 314) and the point 320 (the intersection of 310 and 316), and ends at the fully closed position $306_2$, covering the total distance 306. In other embodiment, the curve 300 may be discontinuous.

Figure 4:
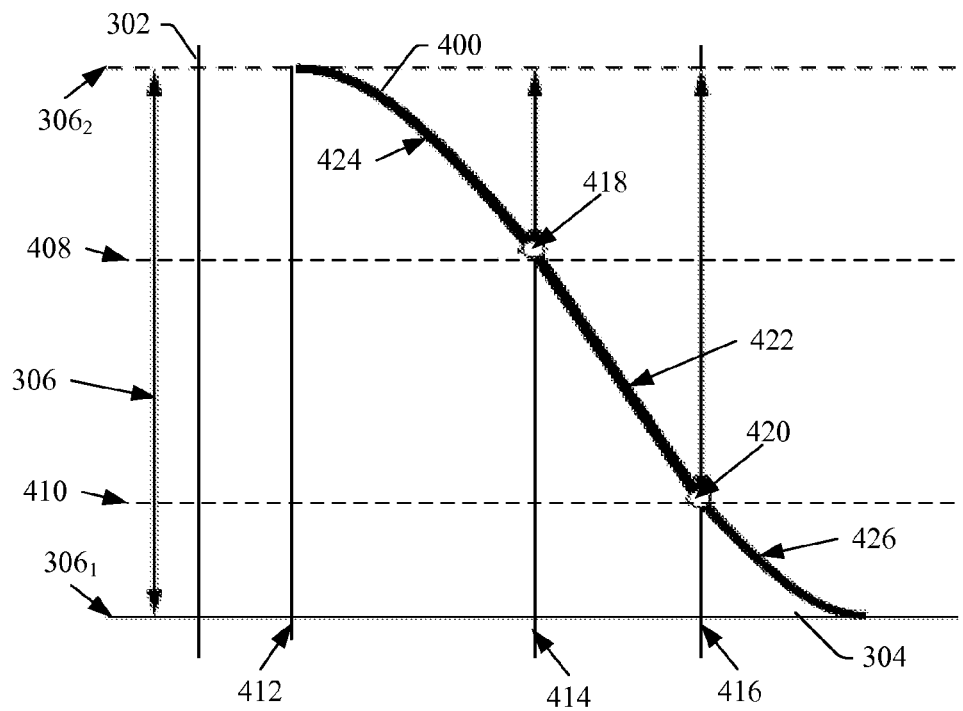
FIG. 4 illustrates an example travel curve for an open operation of the circuit breaker.

FIG. 4 illustrates an estimation of a travel curve 400 for an open (trip) operation of the breaker 106, in which the contacts 108 and 110 transition from a fully closed state to a fully open state. Similar to FIG. 3, the y-axis 302 represents the traveled distance of the contacts and the x-axis 304 represents time.

Indicated on the y-axis 302 are the full range of motion 306 of the contacts, a point 408 during the range 306 where the A switch opens, and a point 410 during the range 306 where the B switch closes. Indicated on the x-axis 304 are a point in time 412 at which a trip command is received, a point in time 414 at which the state of the A switch transitions from closed to open, and a point in time 416 at which the state of the B switch transitions from open to closed.

An intersection 418 of the points 408 and 414 and an intersection 420 of the points 410 and 416 are also indicated. Similar to the portions 322, 324 and 326 of FIG. 3, a portion 422 of the travel curve 400 is estimated via connecting the points 418 and 420, a portion 424 of the curve 400 from where the contacts are fully closed to where the A switch opens is estimated based on the fully open position points $306_2$ and the time at which the trip command is sensed 412 and the intersection point 418, and a portion 426 of the curve 400 from where the B switch closes to where the contacts are fully open is estimated based on the fully open position $306_1$ and the intersection point 420.

Figure 5:
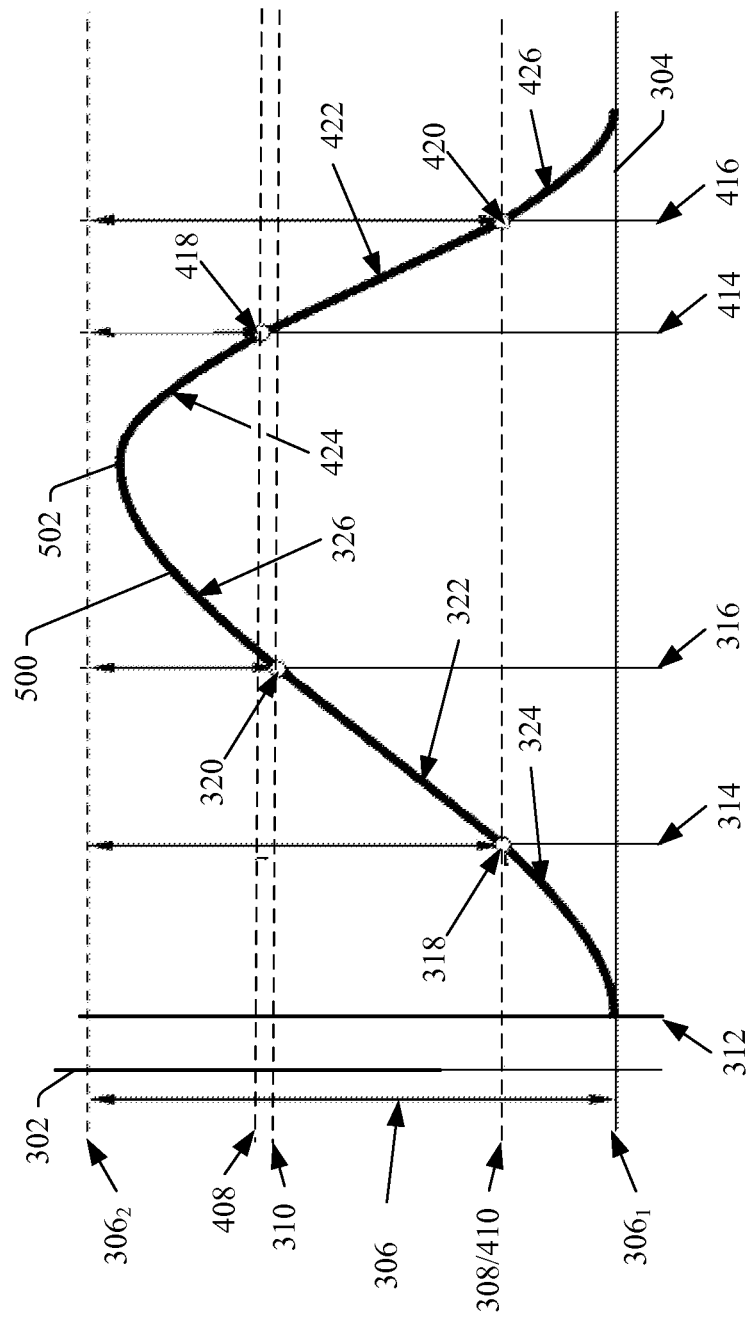
FIG. 5 illustrates an example travel curve for a close-open operation of the circuit breaker.

FIG. 5 illustrates estimation of a travel curve 500 for a close/open operation. Note that in this example, the curve 500 is a combination of the estimated close travel curve 300 (FIG. 3) and the estimated open travel curve 400 (FIG. 4), with the exception that a transition point 502 representing the transition between closed and open states does not reach the fully closed line $306_2$. Similar approaches can be used to estimate other combinations of operations such as open-close-open, close-open-close, and/or other combinations. In another embodiment, the point 502 lies at the fully closed line $306_2$.

The estimated travel curves 300, 400, and 500 may or may not represent the real contact position over time, but they represent a possible and useful mathematical solution that yields the same binary state changes at the exact points in time and that provides the end-user with the appearance of a recorded travel curve. As noted above, the estimated curves allow for determining various parameters such as reaction time, contact velocity, mechanism time, interrupter wear, etc. As such, with possibly some loss in accuracy, the end-user gains the same information from an on-line condition monitor as if a travel sensor and/or actual travel measurements were used.

Moreover, being able to omit travel sensors may greatly reduce the cost and product liability risk of an on-line condition monitor. Furthermore, for factory-installed on-line condition monitors, omission of such components may render the devices more cost competitive. For retrofit markets, for example, where travel sensors are uneconomical and/or risky, omission of such components may add a competitive advantage over products that neither use travel sensors nor calculate travel curves, for example, by offering all or a subset of the diagnostic features that can be extracted from a travel curve.

Figure 6:
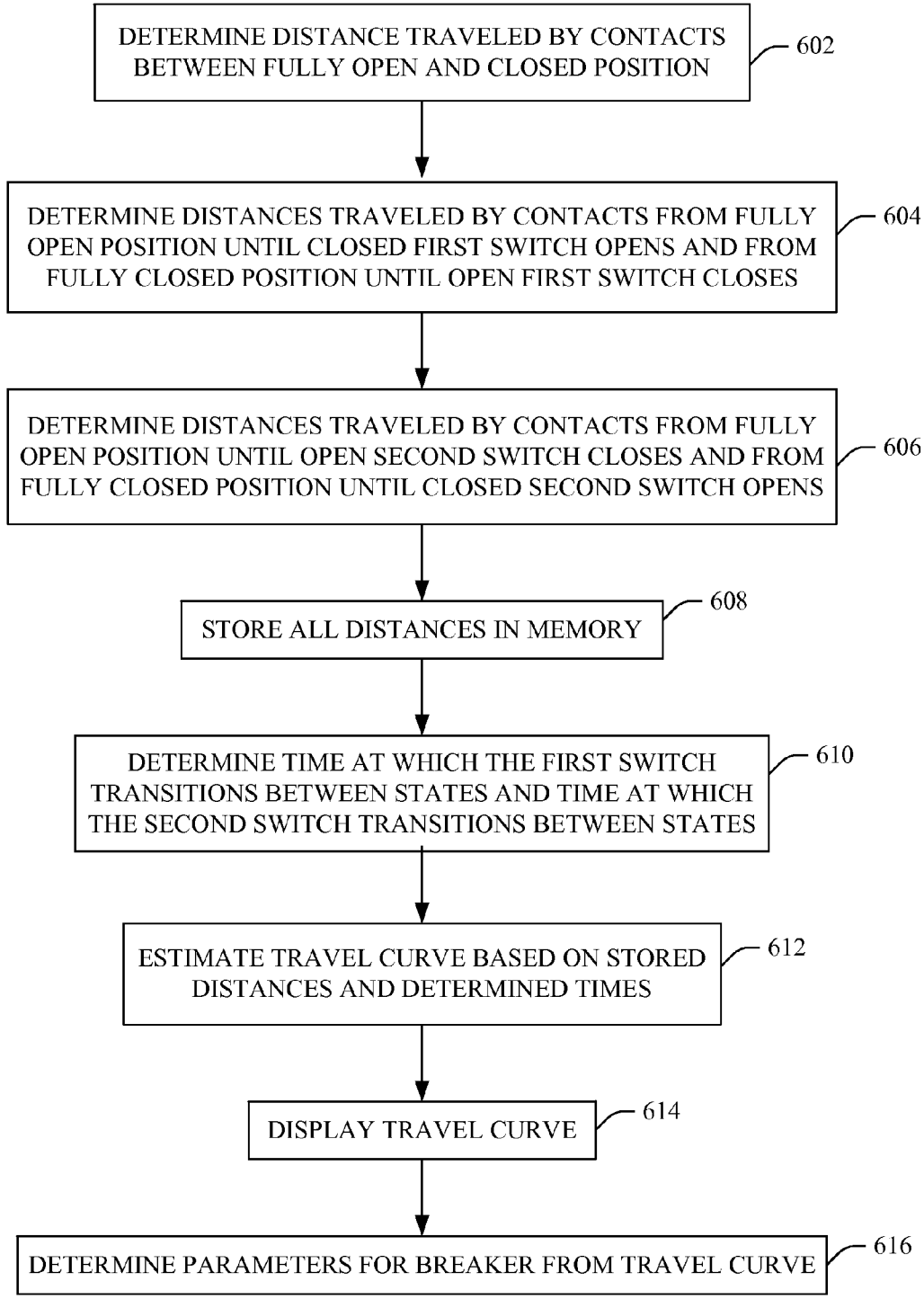
FIG. 6 illustrates an example method for estimating a circuit breaker travel curve.

FIG. 6 illustrates a method for determining one or more travel curves for a high voltage circuit breaker via on-line condition monitoring.

It is to be appreciated that the ordering of the below acts is not limiting. As such, one or more of the acts may occur in a different order. In addition, one or more of the acts may be omitted and/or one or more additional acts may be included.

At 602, a distance traveled by the contacts 108 and 110 between the fully open and the fully closed position is determined.

At 604, distances traveled by the contacts 108 and 110 from the fully open position until a closed first switch opens and from the fully closed position until an open first switch closes are determined.

At 606, distances traveled by the contacts 108 and 110 from the fully open position until an open second switch closes and from the fully closed position until a closed second switch opens are determined.

As disclosed herein, the distances of acts 602-606 can be measured and/or determined based on the design of the breaker 106.

At 608, all of the distances are stored in memory.

At 610, in response to sensing and identifying a circuit breaker operation (e.g., close and/or open) of the breaker, a time(s) at which the first switch transitions between states and a time(s) at which the second switch transitions between states are identified, wherein the identified times are not equal.

At 612, a travel curve for the operation is determined based on the stored distances and the identified times, as described herein.

At 614, the travel curve is displayed in human readable format.

At 616, the travel curve is used to derive various parameters for the breaker as described herein.

The above may be implemented by way of computer readable instructions, which when executed by a computer processor(s), cause the processor(s) to carry out the described techniques. In such a case, the instructions are stored in a computer readable storage medium associated with or otherwise accessible to the relevant computer.

It is to be appreciated that the travel curve can be estimated via the on-line condition monitor 112 (e.g., via the microprocessor 224 and/or other component), another component of the breaker 106, and/or a computing device remote from the breaker 106. Similarly, the parameters derived by from the travel curve can be derived via the on-line condition monitor 112 (e.g., via the microprocessor 224 and/or other component), another component of the breaker 106, and/or a computing device remote from the breaker 106. Likewise, the travel curve and/or one or more parameters derived therefrom can be graphically displayed via the on-line condition monitor 112 (e.g., via the microprocessor 224 and/or other component), another component of the breaker 106, and/or a computing device remote from the breaker 106.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A system, comprising:
a memory that stores pre-determined high voltage circuit breaker contact travel distance information; and
a processor that estimates a travel curve that graphically represents a position over time for at least one of a closed, an open or a combination of closed and open operations for contacts of a high voltage circuit breaker based on both one or more of the pre-determined travel distances of the stored travel distance information and one or more time values corresponding to state transitions of first and second switches, wherein the first and second switches are affixed to the contacts so as to transition between closed and open states as the contacts move between closed and open positions, the breaker does not include a contact travel sensor that measures actual travel distances of the contacts during breaker operations, and the processor extends via extrapolation the travel curve to a fully open position of the contacts from a first point in time on the travel curve that is stored in the memory where a state of the first switch transitions from closed to open as determined by a first switch indicator, and to a fully closed position of the contacts from a second point on the travel curve that is stored in the memory where a state of the second switch transitions from open to closed as determined by a second switch indicator.

2. The system of claim 1, further comprising:
one or more binary indicators that sense the one or more time values.

3. The system of claim 2, wherein the travel distances include one or more of a travel distance of the contacts between fully closed and fully open positions, a travel distance of the contacts from the fully open position until a closed first switch opens, a travel distance of the contacts from the fully open position until an open second switch closes, a travel distance of the contacts from the fully closed position until a closed first switch opens, and a travel distance of the contacts from the closed position until an open first switch closes.

4. The system of claim 3, wherein the breaker operation is a close operation and a first time value of the time values corresponds to the closed first switch opening and a second time value of the time values corresponds to the open second switch closing.

5. The system of claim 4, wherein the processor determines: a first pair value including the travel distance of the contacts from the fully open position until the closed first switch opens and the first time value and a second pair value including the travel distance of the contacts from the fully open position until the open second switch closes and the second time value, and estimates a close operation travel curve by fitting a curve to the first and second pairs values.

6. The system of claim 3, wherein the breaker operation is an open operation and a first time value of the time values corresponds to the closed second switch opening and a second time value of the time values corresponds to the open first switch closing.

7. The system of claim 6, wherein the processor determines: a first pair value including the travel distance of the contacts from the fully closed position until the closed first switch opens and the first time value and a second pair value including the travel distance of the contacts from the fully closed position until the open first switch closes and the second time value, and estimates a trip operation travel curve by fitting a curve to the first and second pairs values.

8. The system of claim 7, wherein the processor extends the close operation travel curve to the fully open and closed contact positions via extrapolation by estimating a first smooth function portion of the travel curve as extending from the first point and concluding with a first point of tangency at a point in time at which a close command is received, and as a second smooth function portion of the travel curve extending from the second point and concluding with a second point of tangency at the fully closed position.

9. The system of claim 1, wherein the processor is a physical component of an on-line monitor integrated with the breaker.

10. The system of claim 1, wherein the processor is a physical component of a computing device that is separate from the breaker.

11. The system of claim 1, wherein the processor calculates at least one of reaction time, contact velocity, mechanism time, or interrupter wear based on the estimated travel curve.

12. The system of claim 1, wherein the estimated travel curve is continuous and differentiable.

13. A method, comprising:
estimating, via a processor, a travel curve that graphically represents a position over time for at least one of a closed, an open or a combination of closed and open operations of circuit interrupter contacts of a high voltage circuit breaker based on both one or more predetermined travel distances of the contacts that are stored in a memory with respect to each other and one or more time values corresponding to state transitions of first and second switches between closed and open states during a breaker operation, wherein the first and second switches are affixed to the contacts so as to transition between closed and open states as the contacts move between closed and open positions, the breaker does not include a contact travel sensor that measures actual travel distances of the contacts during breaker operations, and the processor extends via extrapolation the travel curve to a fully open position of the contacts from a first point in time on the travel curve that is stored in the memory where a state of the first switch transitions from closed to open as determined by a first switch indicator, and to a fully closed position of the contacts from a second point on the travel curve that is stored in the memory where a state of the second switch transitions from open to closed as determined by a second switch indicator.

14. The method of claim 13, further comprising:
estimating the travel curve based on both a first pair value including a travel distance of the contacts from a fully open position until a closed first switch opens and a first time value of the time values corresponding to the closed first switch opening and a second pair value including a travel distance of the contacts from the fully open position until an open second switch closes and a second time value of the time values corresponding to the open second switch closing.

15. The method of claim 13, further comprising:
estimating the travel curve based on both a first pair value including a travel distance of the contacts from a fully closed position until a closed second switch opens and a first time value of the time values corresponding to the closed second switch opening and a second pair value including a travel distance of the contacts from the fully closed position until an open first switch closes and a second time value of the time values corresponding to the open first switch closes, and extending the travel curve to the fully open and closed contact position via extrapolation by estimating a first smooth function portion of the travel curve as extending from the first point and concluding with a first point of tangency at a point in time at which a close command is received, and as a second smooth function portion of the travel curve extending from the second point and concluding with a second point of tangency at the fully closed position.

16. The method of claim 13, further comprising:
estimating the travel curve for combinations of open and close operations by combining estimated travel curves for open operations and close operations.

17. The method of claim 13, further comprising:
estimating the travel curve by mapping the travel distances and switch state time values as a function of time.

18. The method of claim 13, further comprising:
calculating at least one of reaction time, contact velocity, mechanism time, or interrupter wear parameters based on the estimated travel curve.

19. The method of claim 18, wherein the parameters are calculated via an on-line condition monitor integrated with the breaker.

20. The method of claim 18, wherein the parameters are calculated via a computing device located remote from the breaker.

21. The method of claim 13, wherein the estimated travel curve is continuous and differentiable.

22. A method, comprising:
determining, via a processor, one or more parameters for a high voltage circuit breaker based on a travel curve that graphically represents a position over time for at least one of a closed, an open or a combination of closed and open operations of circuit interrupter contacts of the high voltage circuit breaker as a function of time, wherein the travel curve is estimated based on both one or more predetermined travel distances of the contacts that are stored in a memory with respect to each other and one or more time values corresponding to state transitions of first and second switches between closed and open states, wherein the first and second switches are affixed to the contacts so as to transition between closed and open states as the contacts move between closed and open positions, the breaker does not include a contact travel sensor that measures actual travel distances of the contacts during breaker operations, and the via extrapolation the travel curve to a fully open position of the contacts from a first point in time on the travel curve that is stored in the memory where a state of the first switch transitions from closed to open as determined by a first switch indicator, and to a fully closed position of the contacts from a second point on the travel curve that is stored in the memory where a state of the second switch transitions from open to closed as determined by a second switch indicator.

23. The method of claim 22, wherein the one or more parameters includes one or more of a reaction time, a contact velocity, a mechanism time, or an interrupter wear.

24. The method of claim 22, wherein the processor extends the close operation travel curve to the fully open and closed contact positions via extrapolation by estimating a first smooth function portion of the travel curve as extending from the first point and concluding with a first point of tangency at a point in time at which a close command is received, and as a second smooth function portion of the travel curve extending from the second point and concluding with a second point of tangency at the fully closed position.

* * * * *